United States Patent
Li et al.

(10) Patent No.: US 11,576,273 B2
(45) Date of Patent: Feb. 7, 2023

(54) HANDLE MODULE, SERVER, AND SERVER SYSTEM

(71) Applicant: Wiwynn Corporation, New Taipei (TW)

(72) Inventors: Shang-Chien Li, New Taipei (TW); Hung-Lung Lin, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 0 days.

(21) Appl. No.: 17/405,089

(22) Filed: Aug. 18, 2021

(65) Prior Publication Data

US 2022/0369478 A1    Nov. 17, 2022

(30) Foreign Application Priority Data

May 14, 2021 (TW) ................ 110117596

(51) Int. Cl.
*H05K 5/02* (2006.01)
*H05K 7/20* (2006.01)
*H05K 7/14* (2006.01)

(52) U.S. Cl.
CPC ........... *H05K 5/023* (2013.01); *H05K 7/1489* (2013.01); *H05K 7/20272* (2013.01)

(58) Field of Classification Search
None
See application file for complete search history.

(56) References Cited

U.S. PATENT DOCUMENTS

| 4,197,572 A | * | 4/1980 | Aimar | H05K 7/1409 361/755 |
| 10,136,547 B1 | * | 11/2018 | Cecire | H05K 7/20736 |
| 2004/0246695 A1 | * | 12/2004 | Schlack | H05K 7/1409 361/801 |
| 2021/0176900 A1 | * | 6/2021 | Zhu | H05K 7/20927 |

FOREIGN PATENT DOCUMENTS

| CN | 102480882 A | 5/2012 |
| TW | M455325 U | 6/2013 |
| TW | M571512 U | 12/2018 |

OTHER PUBLICATIONS

Examination report dated Apr. 14, 2022, listed in related Taiwan patent application No. 1110117596.

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A handle module applicable to a server or a server system is provided. The handle module includes a handle and a plate. The handle includes a sliding column assembly. The plate includes a first sliding rail and a second sliding rail. The sliding column assembly is pivotably and slidably disposed in the first sliding rail and the second sliding rail. A user pushes the handle to install the server in a rack.

18 Claims, 9 Drawing Sheets

HANDLE MODULE, SERVER, AND SERVER SYSTEM

CROSS-REFERENCE TO RELATED APPLICATION

This non-provisional application claims priority under 35 U.S.C. § 119(a) to Patent Application No. 110117596 filed in Taiwan, R.O.C. on May 14, 2021, the entire contents of which are hereby incorporated by reference.

BACKGROUND

Technical Field

A handle module, especially a handle module configured on a server is provided.

Related Art

Large-scale servers in communication and data centers generally adopt a liquid-cooling system for heat dissipation. Generally, the server is inserted into a rack along slides of the rack to be connected to a liquid-cooling connector. A single-shaft handle is pivotably connected to the server. After the server is inserted into the rack, the handle may be snap-fitted into the rack to position the server in the rack.

SUMMARY

According to some embodiments, a handle module for a server includes a handle and a plate. The handle includes a sliding column assembly. The plate includes a first sliding rail and a second sliding rail. The sliding column assembly is pivotably and slidably disposed in the first sliding rail and the second sliding rail.

In some embodiments, the handle includes a holding portion and an abutting portion, the sliding column assembly is located between the holding portion and the abutting portion. The second sliding rail includes a protruding guide section and a sliding section. The protruding guide section is connected to the sliding section. When the sliding column assembly is located at a joint between the protruding guide section and the sliding section, the abutting portion is exposed from the plate. When the sliding column assembly is pivoted and slid in the sliding section, the abutting portion is substantially maintained at a pivot point.

In some embodiments, the sliding column assembly includes a first guide post and a second guide post, the first guide post is pivotably and slidably disposed in the first sliding rail, the second guide post is pivotably and slidably disposed in the second sliding rail. When the sliding column assembly is pivoted and slid in the sliding section, the plate is moved in a moving direction, the first sliding rail is a substantially linear sliding rail, and a major axis of the linear sliding rail is substantially perpendicular to the moving direction.

In some embodiments, the first guide post is located between the holding portion and the second guide post. The second guide post is located between the first guide post and the abutting portion.

In some embodiments, the plate has a quadrant angle, the quadrant angle has a quadrant center that is a center of the first sliding rail and a +X direction that is a direction in which the major axis of the first sliding rail extends toward the holding portion. The quadrant angle includes a second quadrant, and the second sliding rail is substantially located in the second quadrant.

In some embodiments, the second guide post is located between the holding portion and the first guide post. The second sliding rail is located on one side of the major axis of the first sliding rail.

In some embodiments, the plate has a quadrant angle, the quadrant angle has a quadrant center that is a center of the first sliding rail and a +X direction that is a direction in which the major axis of the first sliding rail extends toward the holding portion. The quadrant angle comprises a third quadrant and a fourth quadrant, and the second sliding rail is located in the third quadrant and the fourth quadrant.

In some embodiments, the first sliding rail is closer to the abutting portion than the second sliding rail.

In some embodiments, the plate has a quadrant angle, the quadrant angle has a quadrant center that is a center of the first sliding rail and a +X direction that is a direction in which the major axis of the first sliding rail extends toward the holding portion. The quadrant angle comprises a first quadrant and a fourth quadrant, and the second sliding rail is located in the first quadrant and the fourth quadrant.

In some embodiments, an end of the protruding guide section that is opposite to the joint is an inward retraction fixed point. When the sliding column assembly is located at the inward retraction fixed point, the abutting portion is inward retraction in the plate.

In some embodiments, an end of the sliding section that is opposite to the joint is an in-position fixed point. When the sliding column assembly is pivoted and slid from the joint to the in-position fixed point, the sliding column assembly is pivoted and slid between a first position of the first sliding rail and a second position of the first sliding rail.

In some embodiments, a distance between the abutting portion and the first sliding rail is greater than 40 mm. When the handle is rotated about the abutting portion, the first guide post of the sliding column assembly is pivoted and slid in the first sliding rail and drives the plate to move along a vertical axis. The vertical axis is perpendicular to the major axis of the first sliding rail.

In some embodiments, an end of the sliding section that is opposite to the joint is an in-position fixed point. The handle module further comprises a slow return element. Two ends of the slow return element are respectively connected to the plate and the handle. The slow return element normally has a retarding force, and the sliding column assembly is pushed toward the in-position fixed point by using the retarding force.

In some embodiments, the handle includes a positioning portion. The plate comprises a fixing portion. When the holding portion of the handle is in an open position, the positioning portion is snap fitted to the fixing portion.

In some embodiments, the handle module further includes a slow return element and a stop, the stop is pivotably connected to the plate. The slow return element has a retarding force, and the first guide post is pushed toward the second position by means of the stop by using the retarding force.

In some embodiments, the stop includes an abutting face. When the first guide post is in the first position, the abutting face is substantially parallel to the major axis of the first sliding rail.

According to some embodiments, a server is provided, includes a server casing and a handle module. The handle module includes a sliding column assembly. The plate includes a first sliding rail and a second sliding rail. The sliding column assembly is pivotably and slidably disposed in the first sliding rail and the second sliding rail the plate is fixed to the server casing.

According to some embodiments, a server system is provided, includes a rack, a server casing, and a handle module. The handle module includes a handle and a plate. The handle includes a sliding column assembly. The plate includes a first sliding rail and a second sliding rail. The sliding column assembly is pivotably and slidably disposed in the first sliding rail and the second sliding rail, the plate is fixed to the server casing. When the sliding column assembly is pivoted and slid in a sliding section, an abutting portion substantially abuts against the abutted portion.

DETAILED DESCRIPTION

Figure 1:
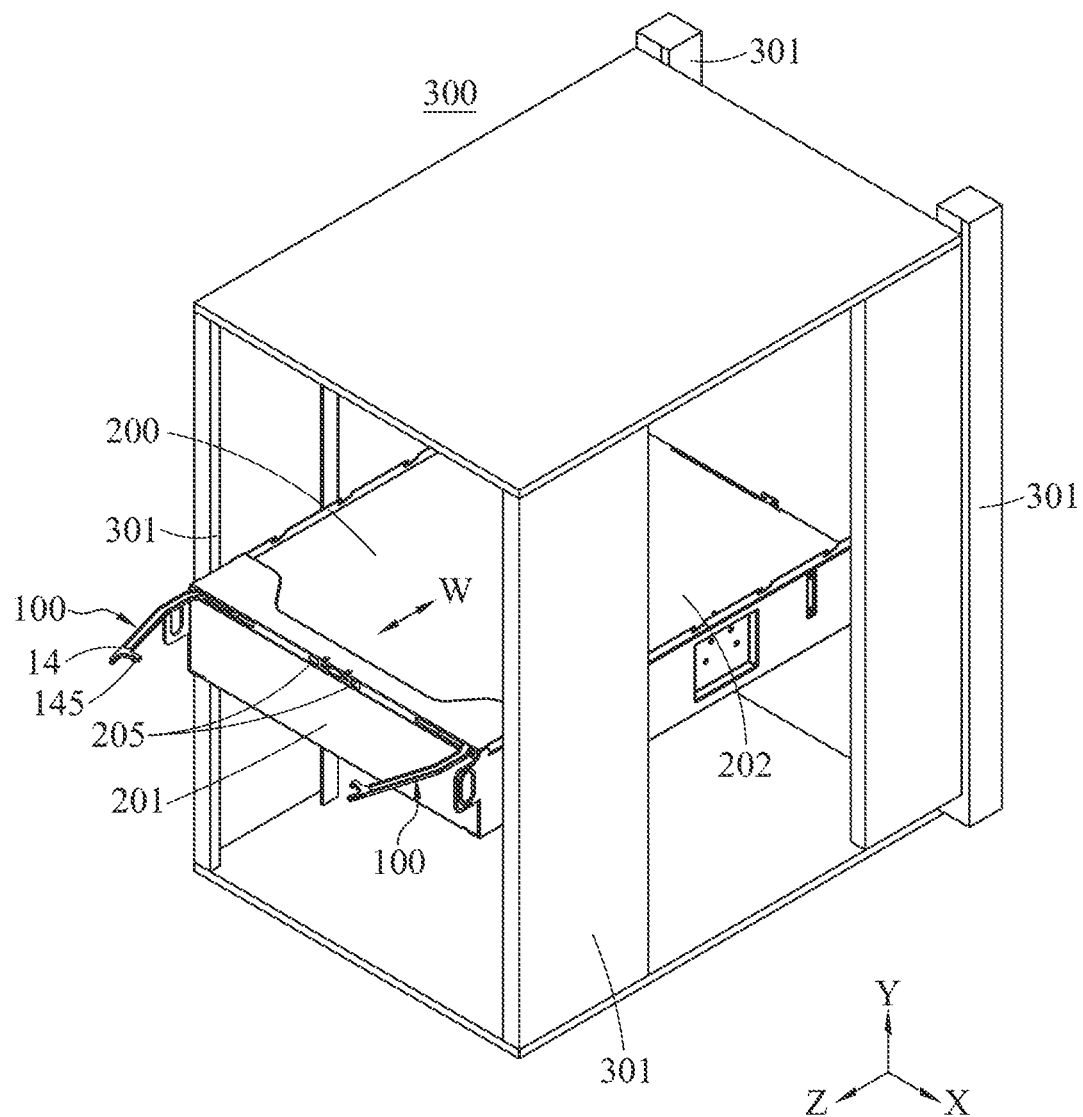
FIG. 1 illustrates a schematic diagram of an appearance of a server system according to some embodiments, showing a status in which a server casing is not inserted into a rack.
Figure 2:
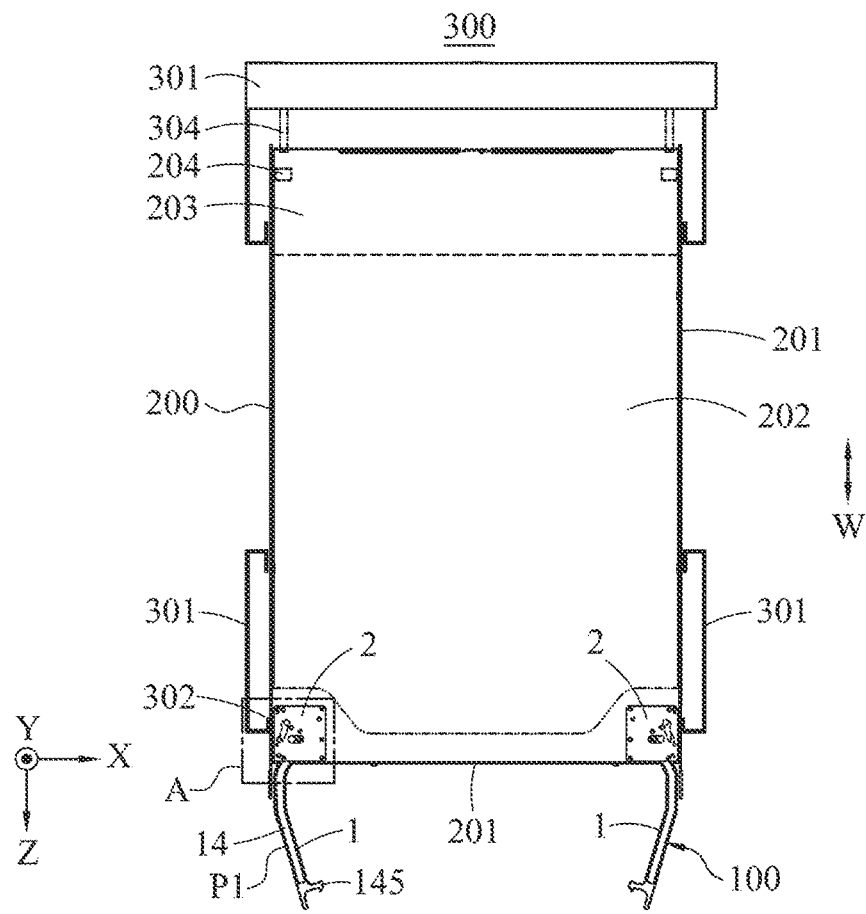
FIG. 2 illustrates a schematic top view of the server system according to some embodiments, showing a status in which a server casing is not inserted into a rack.

Referring to FIG. 1 and FIG. 2, FIG. 1 is a schematic diagram of an appearance of a server system 300, and FIG. 2 is a schematic top view of the server system 300. FIG. 1 and FIG. 2 show a status in which a server casing 201 is not inserted into a rack 301. FIG. 1 illustrates a server casing 201 installed in the rack 301, but the present disclosure is not limited thereto. In some embodiments, a plurality of server casings 201 may be installed in the rack 301. In some embodiments, a server system 300 is disclosed. The server system 300 includes a rack 301, a server casing 201, and a handle module 100. The rack 301 includes an abutted portion 302.

In some embodiments, the rack 301 includes a liquid-cooling adapter 304 (shown by imaginary dash-dot-dot lines on top of FIG. 2). The server system 300 includes a server host 202 and a liquid-cooling device 203. The server host 202 is located in the server casing 201, and the liquid-cooling device 203 is configured to cool the server host 202. The liquid-cooling device 203 includes a liquid-cooling connector 204. The liquid-cooling connector 204 is connected to the liquid-cooling adapter 304 for water-cooled liquid exchange. During a guiding stroke for mating the liquid-cooling connector 204 and liquid-cooling adapter 304, the liquid-cooling connector 204 and the liquid-cooling adapter 304 generate a spring force, which pushes the server host 202 toward outside of the rack 301. Four liquid-cooling connectors 204 are engaged with four liquid-cooling adapters 304, and one set of liquid-cooling connector 204 and liquid-cooling adapter 304 have a spring force of ten kilograms.

The foregoing water-cooled server system 300 is merely an example, and the present disclosure is not limited thereto. In some embodiments, a non-water-cooled server system 300 may be used, that is, a server 200 without the liquid-cooling device 203 may be used, or the server system 300 may adopt heat dissipation devices such as a fan, a heat pipe, or the like.

Referring to FIG. 1 and FIG. 2, in some embodiments, a server 200 is disclosed. The server 200 includes a server casing 201 and a handle module 100. The server 200 further includes a server host 202 and a liquid-cooling device 203. The server host 202 is located in the server casing 201. The liquid-cooling device 203 is configured to cool the server host 202. The liquid-cooling device 203 includes a liquid-cooling connector 204. The liquid-cooling connector 204 is located on one side of the server casing 201.

Figure 3:
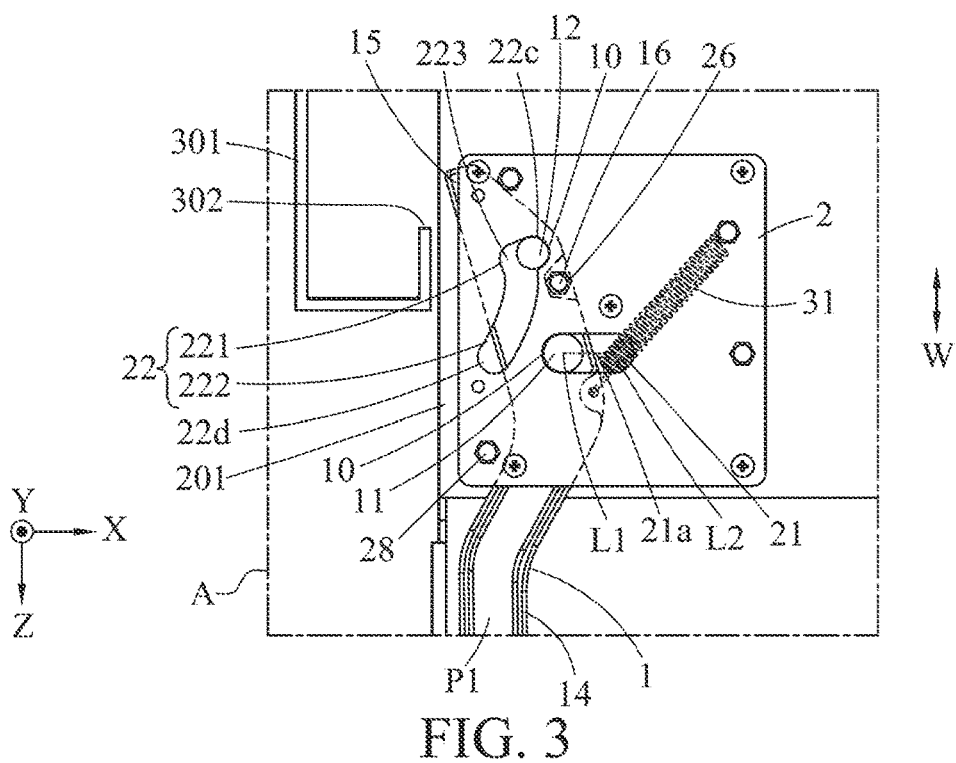
FIG. 3 illustrates an enlarged schematic diagram of a center line frame marked with A in FIG. 2, showing a handle and a slow return element under a plate by using dashed lines.
Figure 4:
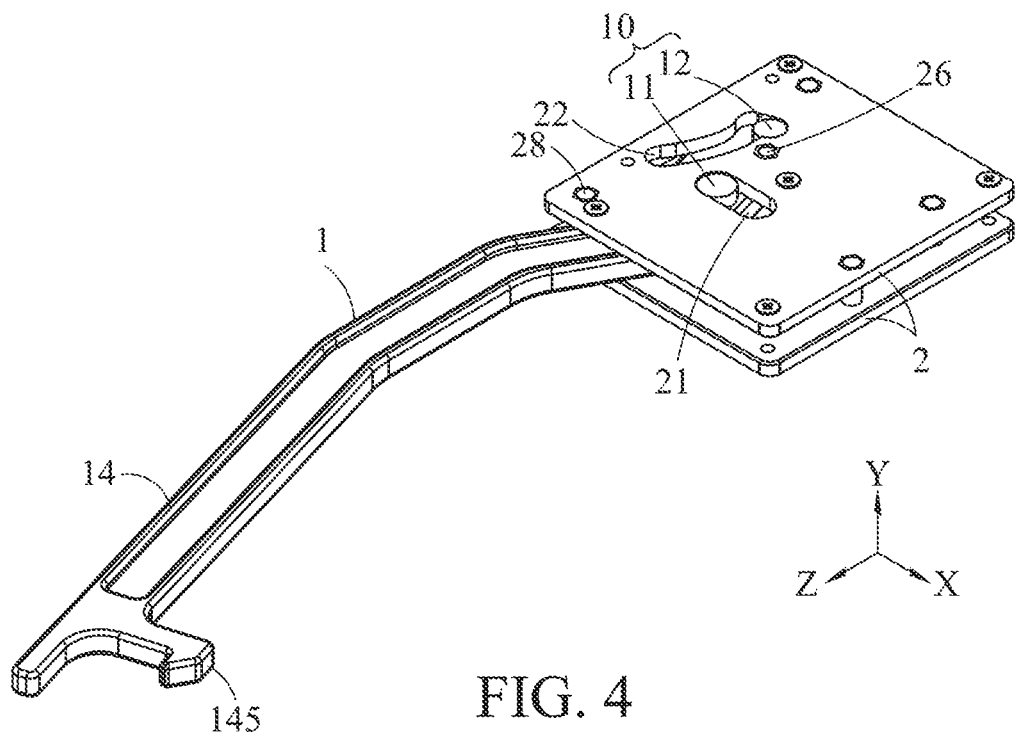
FIG. 4 illustrates a schematic diagram of an appearance of a handle module according to some embodiments.
Figure 5:
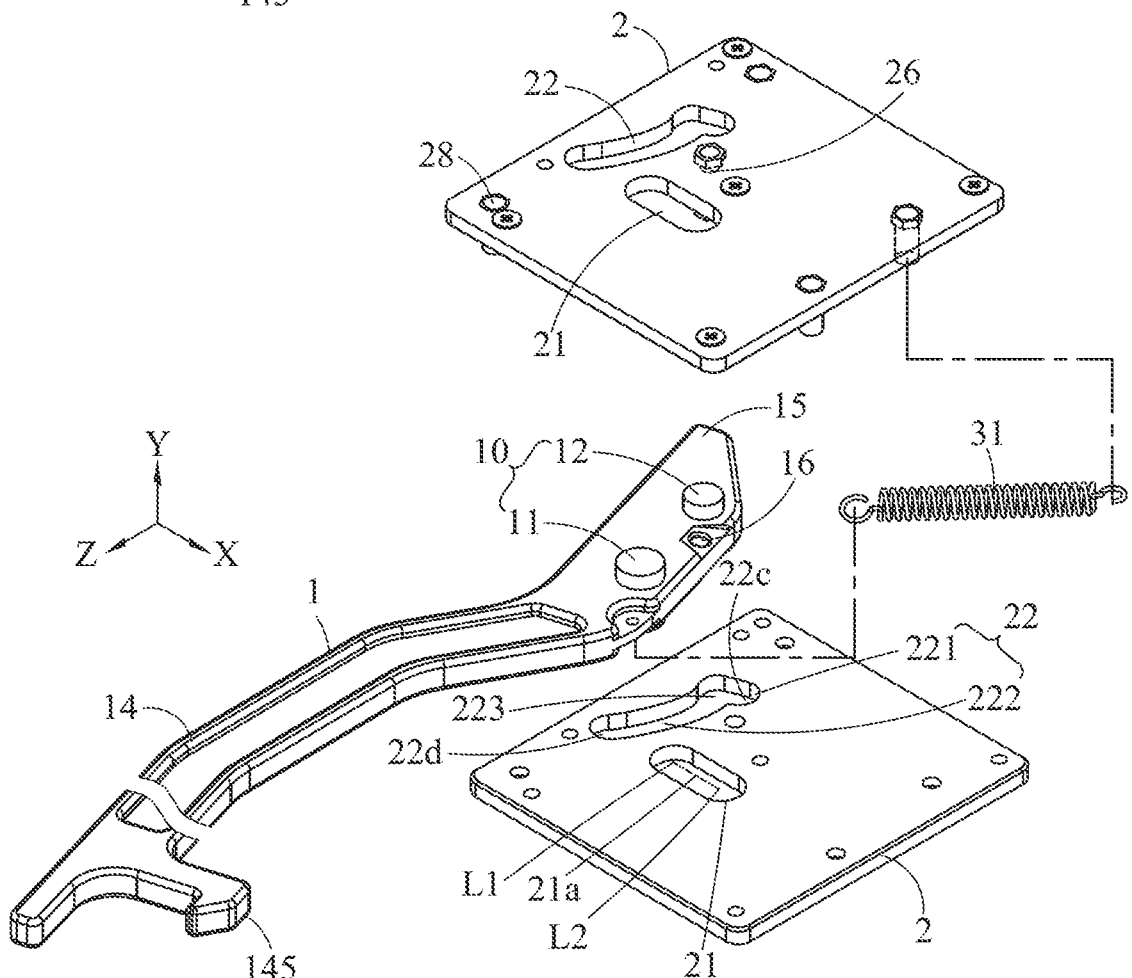
FIG. 5 illustrates an exploded schematic view of the handle module according to some embodiments.

Referring to FIG. 2 to FIG. 5 together, FIG. 3 is an enlarged schematic diagram of a center line frame marked with A in FIG. 2, showing a handle 1 and a slow return element 31 under a plate 2 by using dashed lines, FIG. 4 is a schematic diagram of an appearance of the handle module 100, and FIG. 5 is an exploded schematic view of the handle module 100. In some embodiments, the handle module 100 includes the handle 1 and the plate 2. The handle 1 includes a sliding column assembly 10. The plate 2 includes a first sliding rail 21 and a second sliding rail 22. The sliding column assembly 10 is pivotably and slidably disposed in the first sliding rail 21 and the second sliding rail 22. The plate 2 is fixed to the server casing 201.

Figure 6:
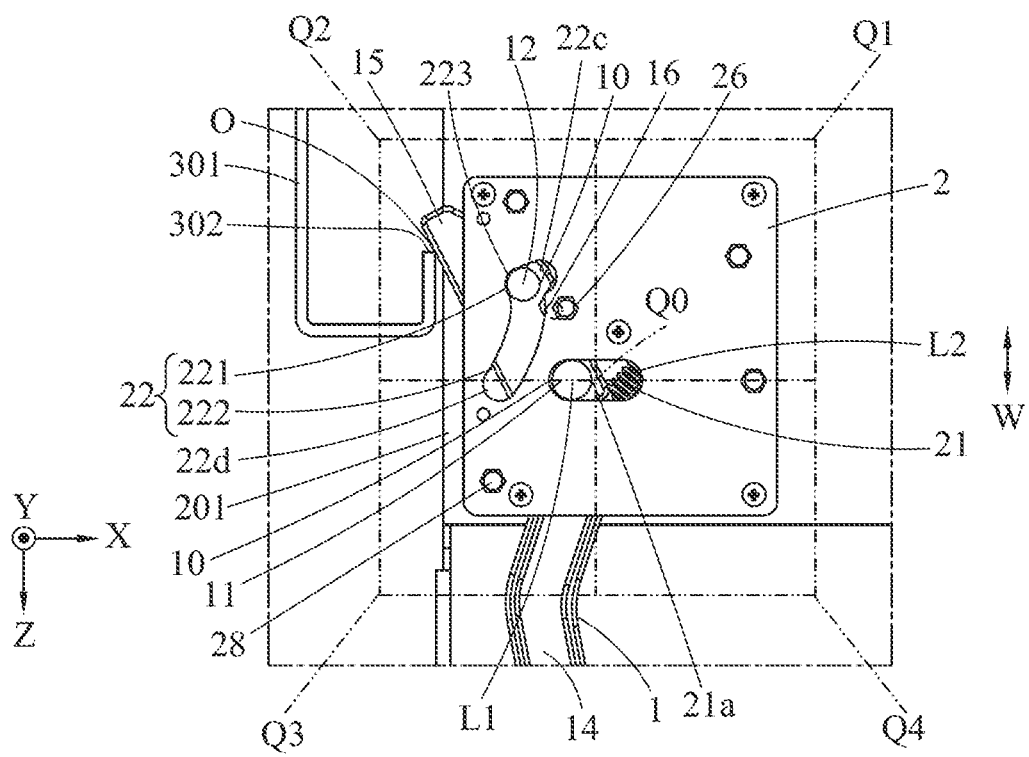
FIG. 6 illustrates a schematic top view during movement of the handle according to some embodiments from a perspective of FIG. 3, where a first guide post is in a first position on a first sliding rail, a second guide post is at a joint of a second sliding rail, and a quadrant angle is presented as a box by using imaginary dash-dot-dot lines.
Figure 7:
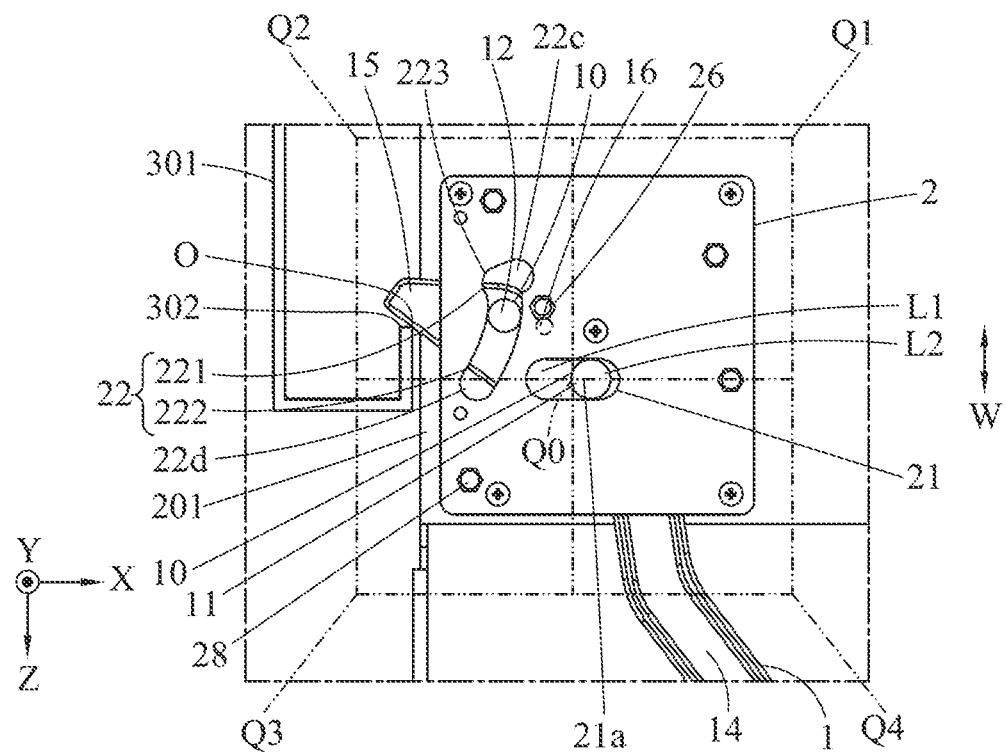
FIG. 7 illustrates a schematic top view during movement of the handle according to some embodiments from a perspective of FIG. 3, where the first guide post is moved toward a second position of the first sliding rail, the second guide post is moved toward an in-position fixed point in the second sliding rail, and a quadrant angle is presented as a box by using imaginary dash-dot-dot lines.
Figure 8:
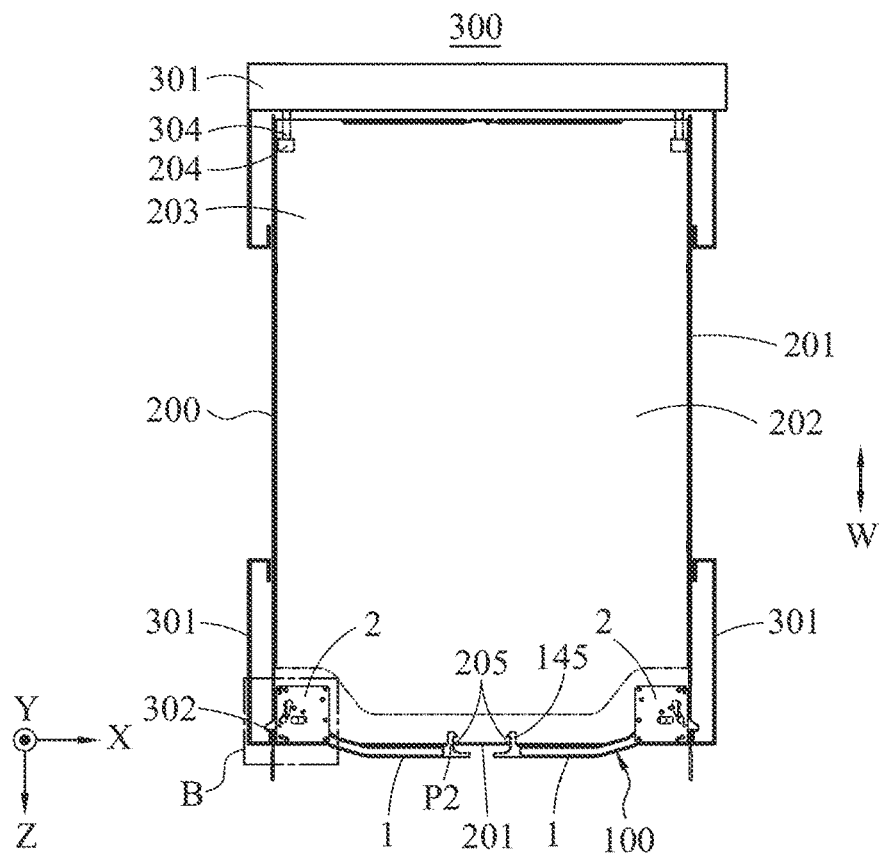
FIG. 8 illustrates a schematic top view of the server system according to some embodiments, showing a status in which the server casing is inserted into the rack, and a holding portion of the handle is snap fitted into the server casing.
Figure 9:
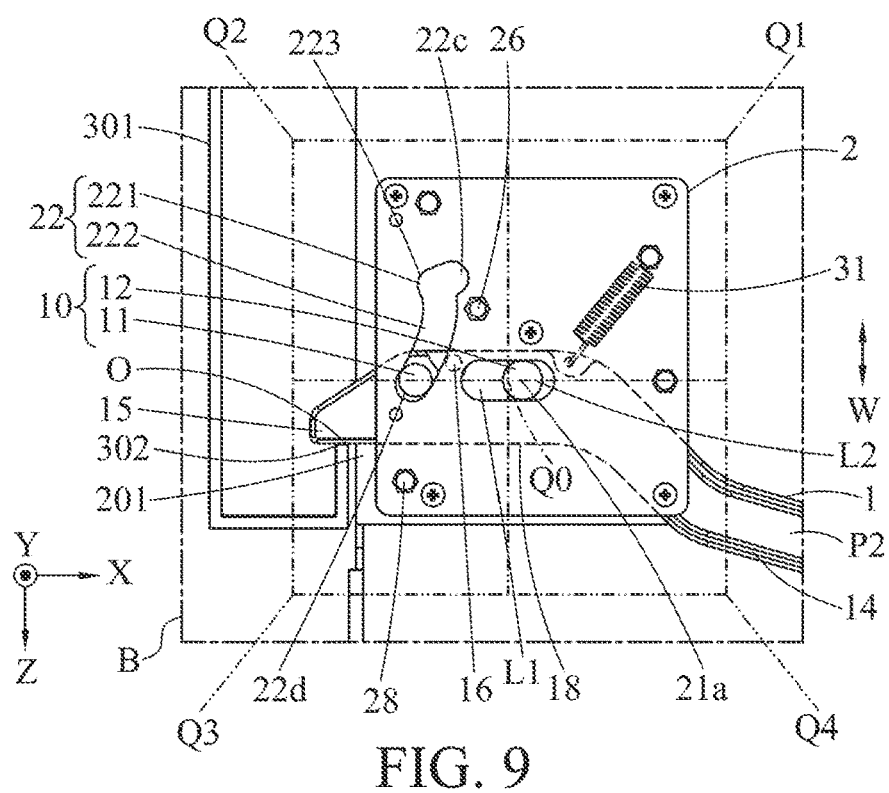
FIG. 9 illustrates an enlarged schematic diagram of a center line frame marked with B in FIG. 8, showing the handle and the slow return element under the plate by using dashed lines, where the quadrant angle is presented as a box by using imaginary dash-dot-dot lines.

Refer to FIG. 2, FIG. 3, and FIG. 6 to FIG. 9 together. FIG. 6 and FIG. 7 are schematic top views during movement of the handle 1. In FIG. 6, a first guide post 11 is in a first position L1 of the first sliding rail 21, and a second guide post 12 is at a joint 223 in the second sliding rail 22. In FIG. 7, the first guide post 11 is slid toward a second position L2 in the first sliding rail 21, and the second guide post 12 is slid toward an in-position fixed point 22d in the second sliding rail 22. FIG. 8 is a schematic top view of the server system 300, showing a status in which the server casing 201 is inserted into the rack 301, and a holding portion 14 of the handle 1 is snap fitted into the server casing 201. FIG. 9 illustrates an enlarged schematic diagram of a center line frame marked with B in FIG. 8, showing the handle 1 and the slow return element 31 under the plate 2 by using dashed lines, where a quadrant angle is presented as a box by using imaginary dash-dot-dot lines. During operation of the sliding column assembly 10, the sliding column assembly 10 is synchronously pivoted and slid in the first sliding rail 21 and the second sliding rail 22, so that the sliding column assembly 10 is rotated and swung relative to the plate 2, and the sliding column assembly 10 is pivoted and slid in the first sliding rail 21 pivots and drives the plate 2 to move. In order to install the server 200 in the rack 301, a user may firstly hold the holding portion 14 of the handle 1, and push the holding portion 14 and the server 200 toward the rack 301, such that the liquid-cooling connector 204 is engaged with the liquid-cooling adapter 304. The handle module 100 drives the server 200 into engagement in a guide stroke distance of 40 mm between the liquid-cooling connector 204 and the liquid-cooling adapter 304, which has an effort-saving effect.

In some embodiments, the guiding stroke for mating the liquid-cooling connector 204 and the liquid-cooling adapter 304 is a long-distance stroke of 40 mm. During the guiding stroke for mating the liquid-cooling connector 204 and the liquid-cooling adapter 304, the sliding column assembly 10 of the handle 1 is pivoted and slid in a sliding section 222 of the second sliding rail 22. An abutting portion 15 of the handle 1 substantially abuts against the abutted portion 302 of the rack 301. The sliding column assembly 10 of the handle 1 is pivoted and slid in the first sliding rail 21 by a moving distance, which is 40 mm. The sliding column assembly 10 is pivoted and slid in the first sliding rail 21 in a direction the same as a moving direction W of the plate 2.

Referring to FIG. 1 to FIG. 3 together, in some embodiments, two handle modules 100 are respectively disposed on two sides of the server casing 201. A user may hold the two handles 1 with both hands to push the server 200 so as to install the server in the rack 301, and cause the handles 1 of the two handle modules 100 to abut against the abutted portions 302 on two sides of the rack 301, but the present disclosure is not limited thereto. In some embodiments, one handle module 100 may be disposed on a side of the server casing 201 for use. The user may hold the handle 1 with one hand and the server casing 201 with an other hand to push the server 200 so as to install the server in the rack 301, and cause the handle 1 of the handle module 100 to abut against the abutted portion 302 on one side of the rack 301.

Referring to FIG. 5 to FIG. 6 together, in some embodiments, the handle module 100 includes a plurality of plates 2. The handle 1 is pivotably and slidably disposed between the plurality of plates 2, but the present disclosure is not limited thereto. In some embodiments, the handle module 100 may include one plate 2 for the handle 1 to be pivotably and slidably disposed, the plate 2 is locked to the server casing 201, and the handle 1 is limited to between the plate 2 and the server casing 201.

Referring to FIG. 1 to FIG. 5 together, in some embodiments, two ends of the handle 1 respectively include the holding portion 14 and the abutting portion 15. The holding portion 14 is a free end, and the abutting portion 15 is a shaft end. The sliding column assembly 10 is located between the holding portion 14 and the abutting portion 15.

Referring to FIG. 1 to FIG. 5 together, in some embodiments, the second sliding rail 22 includes a protruding guide section 221 and the sliding section 222. The protruding guide section 221 is connected to the sliding section 222. The first sliding rail 21 is a horizontal shaft disposed on the plate 2, but the present disclosure is not limited thereto. The first sliding rail 21 may be a non-horizontal shaft that is obliquely disposed.

Referring to FIG. 1 to FIG. 5 together, in some embodiments, the second sliding rail 22 is substantially an arcuate sliding rail. The sliding section 222 is an arcuate structure disposed on the plate 2. An arcuate sliding rail of the second sliding rail 22 is constructed by using the first sliding rail 21 as a center for the second guide post 12 to slide along a sliding path in the second sliding rail 22 by using the first guide post 11 as a center. The arcuate sliding rail of the second sliding rail 22 is disposed around the first sliding rail 21.

Referring to FIG. 1 to FIG. 5 together, in some embodiments, the sliding column assembly 10 includes the first guide post 11 and the second guide post 12. The first guide post 11 is pivotably and slidably disposed in the first sliding rail 21 (the first guide post 11 is an active shaft driving the plate 2 to move). The second guide post 12 is pivotably and slidably disposed in the second sliding rail 22 (the second guide post 12 is a guide shaft guiding the handle 1 to rotate). The sliding column assembly 10 is formed into a twin-shaft type and is pivotably connected to the first sliding rail 21 and the second sliding rail 22 and is slid synchronously.

Referring to FIG. 1 to FIG. 5 together, in some embodiments, the first guide post 11 and the second guide post 12 are cylindrical and may be integrally formed on the handle 1, but the present disclosure is not limited thereto. In some embodiments, the first guide post 11 and the second guide post 12 may be screws, studs, steel posts, or the like, and are fixed to the handle 1 by means of locking. In some embodiments, the first guide post 11 and the second guide post 12 may have different diameters or the same diameter.

Referring to FIG. 2, FIG. 3, FIG. 8, and FIG. 9 together, in some embodiments, the handle 1 is pivotably and slidably disposed on the plate 2. The handle 1 operates as a lever. A fulcrum of the lever is a point at which the handle 1 comes into contact with the abutted portion 302 of the rack 301 by using the abutting portion 15 and the contact point of the. A force applying point of the lever is the holding portion 14 of the handle 1. A force resisting point of the lever is a point at which the first guide post 11 of the sliding column assembly 10 comes into contact with the first sliding rail 21. The fulcrum and the force applying point of the lever are respectively located on the two ends of the handle 1. The force resisting point of the lever is located between the fulcrum and the force applying point, and the force resisting point is disposed close to the fulcrum. The fulcrum is located at a point at which the handle 1 comes into contact with the rack 301, so that the force applying point can obtain a maximum force arm to obtain a desirable effort-saving ratio.

Referring to FIG. 2 to FIG. 3 together, in some embodiments, an end of protruding guide section 221 of the second sliding rail 22 that is opposite to the joint 223 is an inward retraction fixed point 22c. When the sliding column assembly 10 is at the inward retraction fixed point 22c, the abutting portion 15 is inward retraction in the plate 2. During installation of the server 200 in the rack 301, the abutting portion 15 is not exposed from the plate 2 and therefore does not collide with the abutted portion 302 of the rack 301.

Referring to FIG. 2 to FIG. 6 together, in some embodiments, when the server 200 is installed in the rack 301, the holding portion 14 of the handle 1 is moved toward the server casing 201, and the sliding column assembly 10 is slid to the joint 223 between the protruding guide section 221 and the sliding section 222 from the inward retraction fixed point 22c, and the abutting portion 15 is exposed from the plate 2 and abuts against the abutted portion 302 of the rack 301.

Referring to FIG. 5, FIG. 8, and FIG. 9 together, in some embodiments, an end of the sliding section 222 that is opposite to the joint 223 is an in-position fixed point 22d. During pushing of the holding portion 14 of the handle 1 toward the server casing 201 (between an open position P1 of the holding portion 14 shown in FIG. 2 and a closed position P2 of the holding portion 14 shown in FIG. 8), the sliding column assembly 10 is pivoted and slid from the joint 223 to the in-position fixed point 22d, and the sliding column assembly 10 is pivoted and slid between the first position L1 of the first sliding rail 21 and the second position L2 of the first sliding rail 21. In some embodiments, the second guide post 12 and the first guide post 11 at the in-position fixed point 22d are located on the same horizontal axis (an X axis shown in FIG. 9). The abutting portion 15 is substantially equivalent to the horizontal axis (the X axis shown in FIG. 9) and abuts against the abutted portion 302 of the rack 301. The horizontal axis (the X axis shown in FIG. 9) is substantially perpendicular to the moving direction W (a Z axis shown in FIG. 9) of the plate 2.

Referring to FIG. 1 to FIG. 5 together, in some embodiments, during the pivoting and sliding of the sliding column assembly 10, when the first guide post 11 of the sliding column assembly 10 is pivoted and slid in the first sliding rail 21, the second guide post 12 of the sliding column assembly 10 is synchronously pivoted and slid in the second sliding rail 22, but the present disclosure is not limited thereto. In some embodiments, during the pivoting and sliding of the sliding column assembly 10, when the first guide post 11 of the sliding column assembly 10 is pivoted and slid in the first sliding rail 21, the second guide post 12 of the sliding column assembly 10 is pivoted in place in the second sliding rail 22 without sliding, or when the second guide post 12 of the sliding column assembly 10 is pivoted and slid in the second sliding rail 22, the first guide post 11 of the sliding column assembly 10 is pivoted in place in the first sliding rail 21 without sliding.

Referring to FIG. 2, FIG. 3, and FIG. 6 to FIG. 9 together, when the sliding column assembly 10 is pivoted and slid in the sliding section 222, the plate 2 is moved in the moving direction W (a direction indicated by a Z-axis arrow shown in FIG. 3). The first sliding rail 21 is a substantially linear sliding rail, and a major axis 21a of the linear sliding rail (shown by imaginary dash-dot-dot lines in FIG. 3) is substantially perpendicular to the moving direction W. Since the first guide post 11 is to be pivoted and slid in the first sliding rail 21, an operating track of the handle 1 during rotation needs to be limited by means of guidance of the second guide post 12 and the second sliding rail 22.

Referring to FIG. 2, FIG. 3, and FIG. 6 to FIG. 9 together, in some embodiments, the abutting portion 15 is a fulcrum center for rotation of the handle 1. An imaginary circle is defined by using the fulcrum center. A radius of the circle is greater than 40 mm. A distance between the abutting portion 15 (the fulcrum center) and the first guide post 11 is the radius of the imaginary circle. When the sliding column assembly 10 is pivoted and slid in the sliding section 222, the abutting portion 15 is substantially maintained at a pivot point O (shown in FIG. 6). A distance between the abutting portion 15 and the first sliding rail 21 is greater than 40 mm. When the handle 1 is rotated about the abutting portion 15 (the pivot point O at which the abutting portion 15 is in contact with the abutted portion 302 of the rack 301), the first guide post 11 of the sliding column assembly 10 is pivoted and slid in the first sliding rail 21 and drives the plate 2 to move along a vertical axis (a Z axis shown in FIG. 6 and FIG. 7, which is the same as the moving direction W). The vertical axis is perpendicular to the major axis 21a of the first sliding rail 21. In some embodiments, the handle 1 is rotated by about 70 degrees or less than 90 degrees (between the open position P1 of the holding portion 14 that is shown in FIG. 2 and the closed position P2 of the holding portion 14 that is shown in FIG. 8).

Referring to FIG. 2, FIG. 3, and FIG. 6 to FIG. 9 together, in some embodiments, when the handle 1 is rotated about the abutting portion 15, the abutting portion 15 comes into contact with the abutted portion 302 (shown in FIG. 6) of the rack 301. At the point at which the abutting portion 15 comes into contact with the abutted portion 302, the abutting portion 15 is not linearly moved, and the abutting portion 15 is rotated at the fulcrum center of the contact point, avoiding problems such as wear, abrasion, and non-smooth operation as a result of movement of the abutting portion 15.

Referring also to FIG. 9, in some embodiments, the plate 2 has a quadrant angle. The quadrant angle has a quadrant center Q0 that is a center of the first sliding rail 21 and a +X direction that is a direction in which the major axis 21a of the first sliding rail 21 extends toward the holding portion 14. The quadrant angle includes a second quadrant Q2, and the second sliding rail 22 is substantially located in the second quadrant Q2. In the embodiment of FIG. 9, most part of the second sliding rail 22 is located in the second quadrant Q2, and small part of the second sliding rail 22 is located in a third quadrant Q3.

Figure 10:
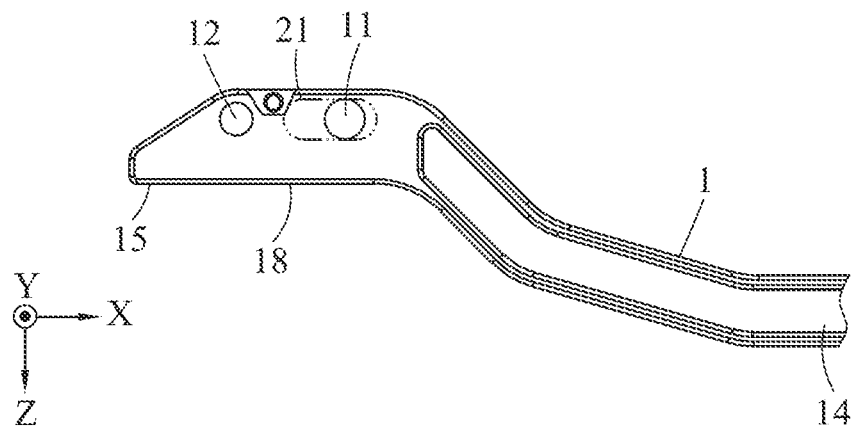
FIG. 10 illustrates a schematic top view of part of the handle according to some embodiments, where the first guide post and the second guide post are located on the same horizontal axis, and the first sliding rail is presented by using imaginary lines.

Referring to FIG. 9 and FIG. 10 together, FIG. 10 is a schematic top view of part of the handle 1. The first guide post 11 and the second guide post 12 are located on the same horizontal axis (such as the X axis). The first sliding rail 21 is presented by using imaginary lines. In some embodiments, the first guide post 11 is located between the holding portion 14 and the second guide post 12. The second guide post 12 is correspondingly located between the first guide post 11 and the abutting portion 15. An inner side of the handle 1 includes a recess 18. The plate 2 includes a locking portion 28. The locking portion 28 is located in the third quadrant Q3 (detailed later) of the plate 2. A reserved distance exists between the locking portion 28 and the first guide post 11 of the sliding column assembly 10. After the holding portion 14 of the handle 1 is swung out of the plate 2, or after the holding portion 14 of the handle 1 is swung into the plate 2, the locking portion 28 is located in the recess 18, preventing the handle 1 from colliding with the locking portion 28 during rotation.

Figure 11:
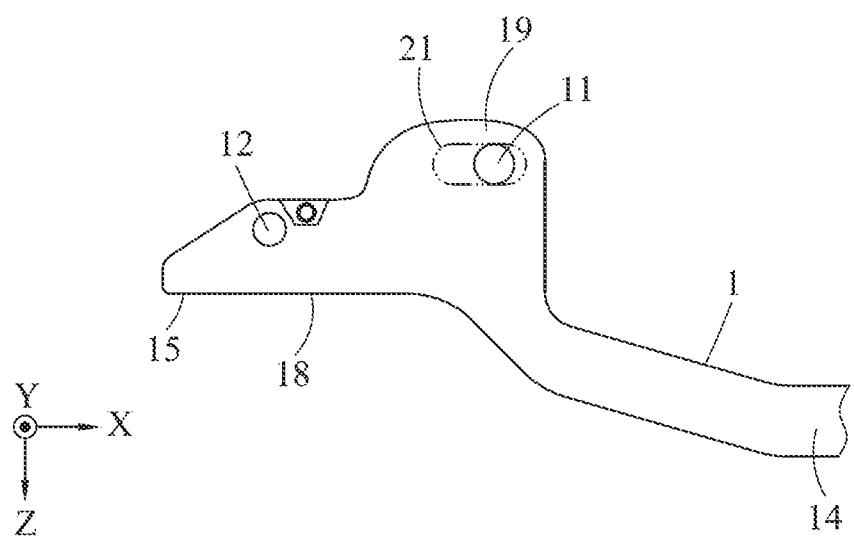
FIG. 11 illustrates a schematic top view of part of the handle according to some embodiments, where the first guide post is located on a protrusion, the first guide post and the second guide post are located on different horizontal axes, and the first sliding rail is presented by using imaginary lines.

Referring also to FIG. 11, FIG. 11 is a schematic top view of part of the handle 1. In some embodiments, the handle 1 includes a protrusion 19. The first guide post 11 is disposed on the protrusion 19. The protrusion 19 is located in the first quadrant Q1 of the plate 2 as shown in FIG. 9 (detailed later). The first guide post 11 and the second guide post 12 are located on different horizontal axes. When the first guide post 11 is disposed on the protrusion 19, a distance between the first guide post 11 and the abutting portion 15 is increased. The distance between the first guide post 11 and the abutting portion 15 in FIG. 11 is greater than a distance between the first guide post 11 and the abutting portion 15 in FIG. 10, so that the handle 1 can be prevented from colliding with the locking portion 28 shown in FIG. 9 during rotation. If desired, the first guide post 11 may be disposed at any position on the handle 1 to change pivoting and sliding angles or positions of the first guide post 11 and the second guide post 12 in the first sliding rail 21 and the second sliding rail 22 considering a distance to the second guide post 12.

Referring to FIG. 2 and FIG. 8 together, in some embodiments, when a user pushes the holding portion 14 of the handle 1 from the open position P1 to the closed position P2, the holding portion 14 is swung toward a panel of the server casing 201. When the holding portion 14 of the handle 1 is swung to the closed position P2, a hook 145 of the holding portion 14 is snap fitted into a buckle hole 205 of the server casing 201 to prevent the handle 1 from ejecting out.

Figure 12:
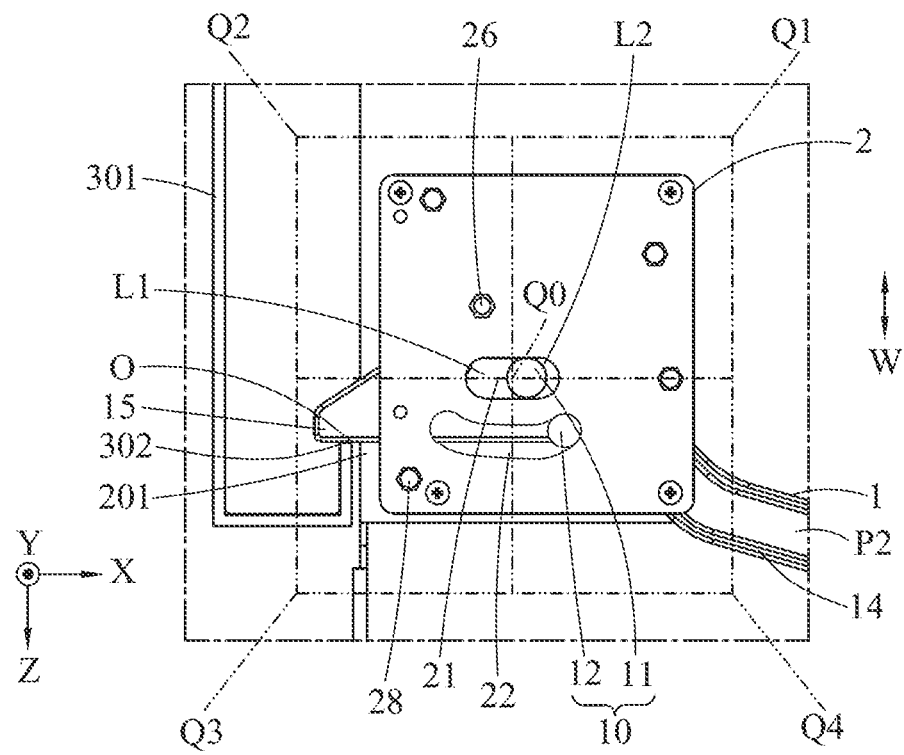
FIG. 12 illustrates a schematic top view in which the handle abuts against the rack according to some embodiments from a perspective of FIG. 9, where the second sliding rail is located in a third quadrant and a fourth quadrant, and the quadrant angle is presented as a box by using imaginary dash-dot-dot lines.

Referring also to FIG. 12, in some embodiments, the quadrant angle includes the third quadrant Q3 and the fourth quadrant Q4, and the second sliding rail 22 is located in the third quadrant Q3 and the fourth quadrant Q4. The second guide post 12 is located between the holding portion 14 and the first guide post 11. The second sliding rail 22 is located on one side of the major axis 21a of the first sliding rail 21 (below the first sliding rail 21 as shown in FIG. 12). During operation of the sliding column assembly 10, the first guide post 11 of the sliding column assembly 10 is pivoted in the first sliding rail 21, and the second guide post 12 of the sliding column assembly 10 is synchronously pivoted in the second sliding rail 22, so that the sliding column assembly 10 is rotated and swung relative to the plate 2, and the first guide post 11 and the second guide post 12 of the sliding column assembly 10 drive the plate 2 to move.

Figure 13:
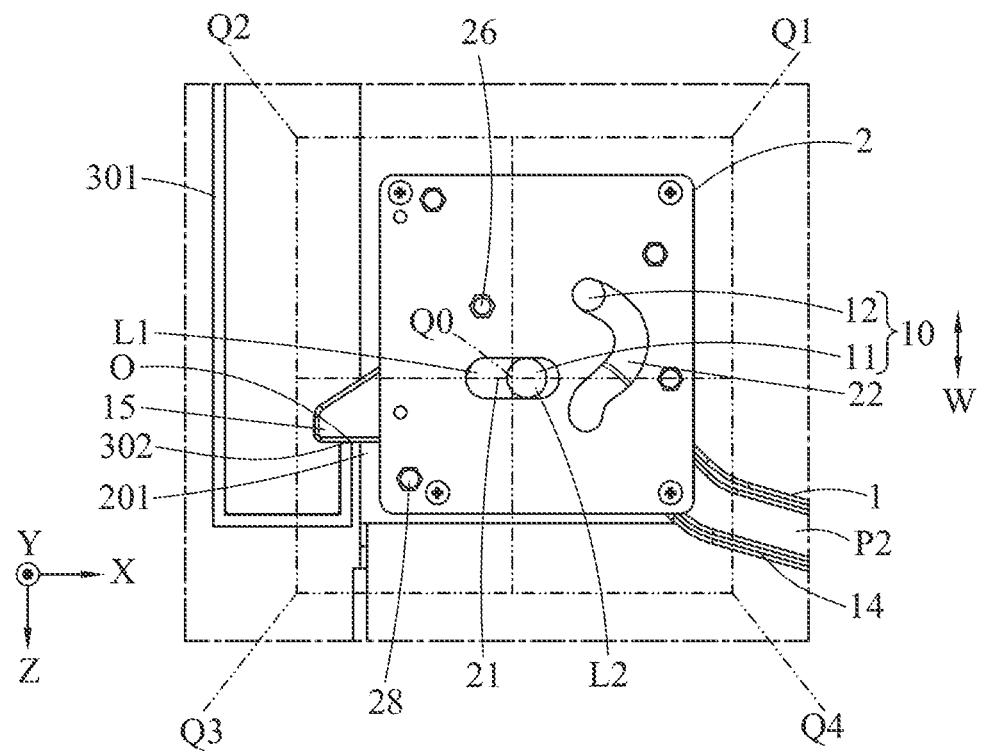
FIG. 13 illustrates a schematic top view in which the handle abuts against the rack according to some embodiments from the perspective of FIG. 9, where the second sliding rail is located in a first quadrant and a fourth quadrant, and the quadrant angle is presented as a box by using imaginary dash-dot-dot lines.

Referring also to FIG. 13, in some embodiments, the quadrant angle includes the first quadrant Q1 and the fourth quadrant Q4, and the second sliding rail 22 is located in the first quadrant Q1 and the fourth quadrant Q4. The first sliding rail 21 is closer to the abutting portion 15 than the second sliding rail 22. During operation of the sliding column assembly 10, the first guide post 11 of the sliding column assembly 10 is pivoted in the first sliding rail 21, and the second guide post 12 of the sliding column assembly 10 is synchronously pivoted in the second sliding rail 22, so that the sliding column assembly 10 is rotated and swung relative to the plate 2, and the first guide post 11 of the sliding column assembly 10 drives the plate 2 to move.

Referring to FIG. 3, FIG. 5, and FIG. 9 together, in some embodiments, the handle module 100 further includes a slow return element 31 (a tension spring 31 is exemplified below for illustration, and is assigned the same reference numeral as the slow return element 31). Two ends of the tension spring 31 are respectively connected to the plate 2 and the handle 1. The tension spring 31 normally has a retarding force. The sliding column assembly 10 is pushed toward the in-position fixed point 22d by using the retarding force. When the high spring force of the liquid-cooling connector 204 and the liquid-cooling adapter 304 ejects the server 200 out of the rack 301, the holding portion 14 of the handle 1 and the server casing 201 are driven to eject out of the rack 301. The handle 1 is restrained by using the tension spring 31, and the holding portion 14 of the handle 1 and is ejected toward the server casing 201, so as to reduce an ejecting speed of the holding portion 14 of the handle 1, thereby avoiding a thread to use safety as a result of the holding portion 14 of the handle 1 ejecting out quickly.

Referring to FIG. 3, FIG. 5, and FIG. 9 together, in some embodiments, the handle 1 includes a positioning portion 16. The plate 2 includes a fixing portion 26. The positioning portion 16 and the fixing portion 26 are respectively a concave structure and a convex structure for buckling. When the holding portion 14 of the handle 1 is in the open position P1, the positioning portion 16 is snap fitted into the fixing portion 26 to position the handle 1 after the handle is opened.

Figure 14:
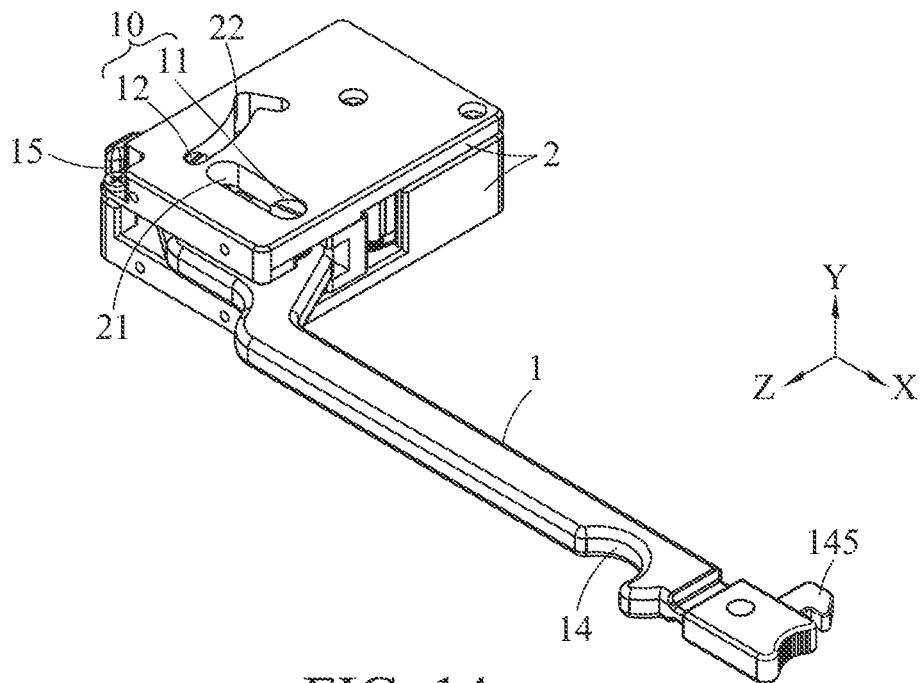
FIG. 14 illustrates a schematic diagram of an appearance of another handle module according to some embodiments.
Figure 15:
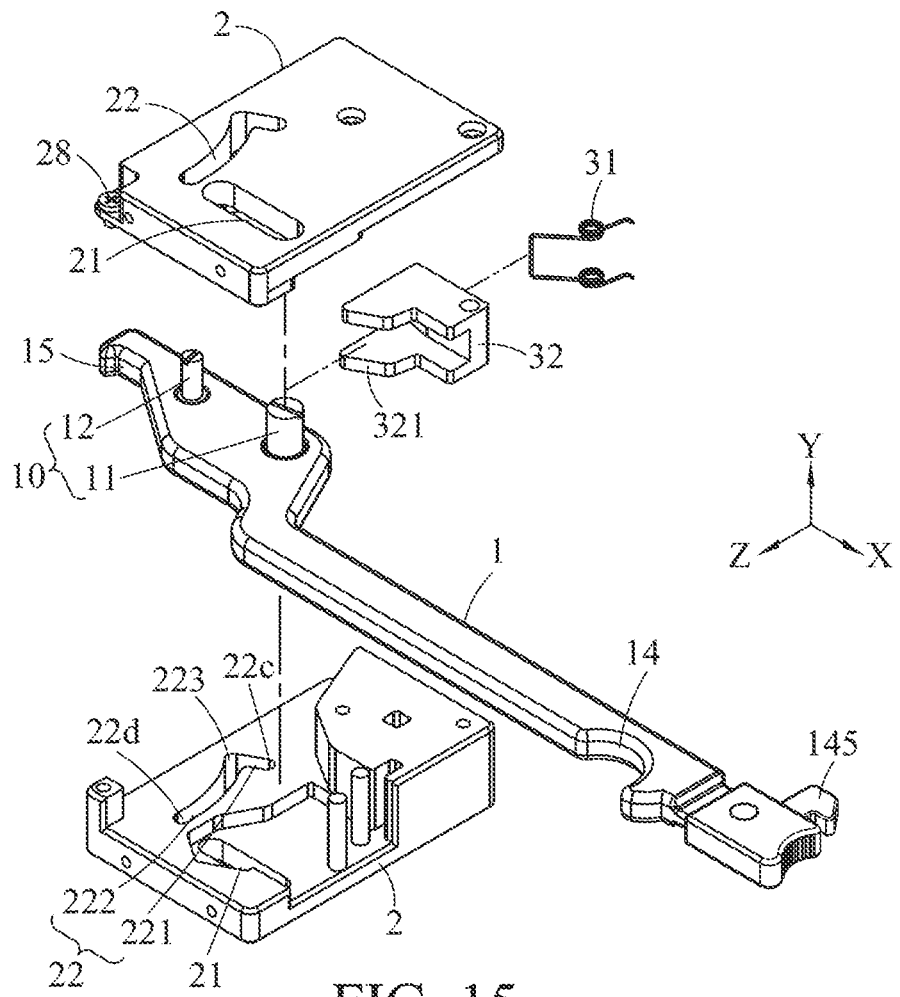
FIG. 15 illustrates an exploded schematic view of the another handle module according to some embodiments.
Figure 16:
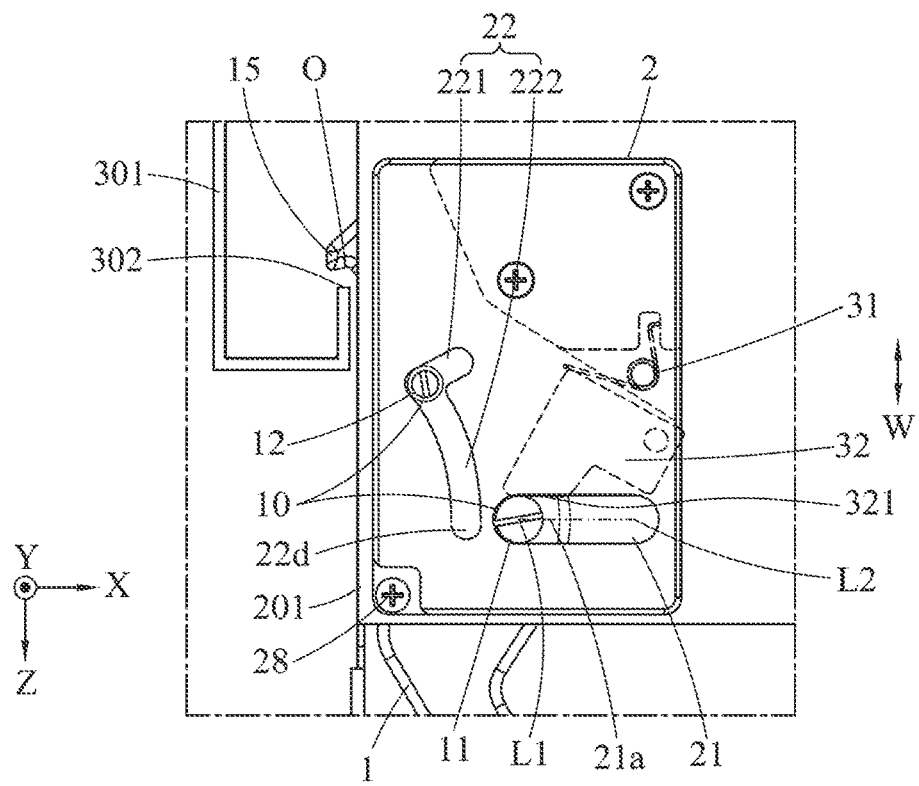
FIG. 16 illustrates a schematic top view during movement of a handle of the another handle module according to some embodiments from the perspective of FIG. 3, where a first guide post is in a first position of a first sliding rail, a second guide post is at a joint in a second sliding rail, a slow return element and a stop are presented by using dashed lines, and an abutting face of the stop abuts against a top of the first guide post.
Figure 17:
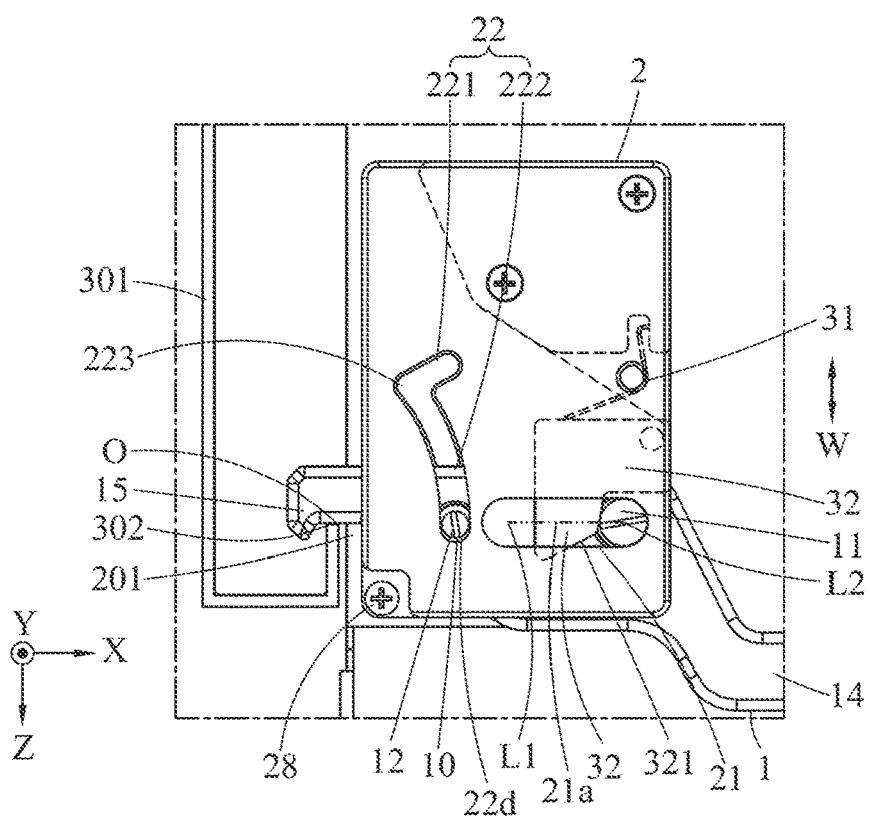
FIG. 17 illustrates a schematic top view during movement of the handle of the another handle module according to some embodiments from the perspective of FIG. 9, where the first guide post is in a second position of the first sliding rail, the second guide post is at an in-position fixed point in the second sliding rail, the slow return element and the stop are presented by using dashed lines, and the stop abuts against a side of the first guide post.

FIG. 14 to FIG. 17 show embodiments of another handle module 100. FIG. 14 is a schematic view of an appearance, FIG. 15 is an exploded schematic view, and FIG. 16 and FIG. 17 are schematic top views during movement of a handle 1. A slow return element 31 and a stop 32 are presented by using dashed lines. In FIG. 16, a first guide post 11 is in a first position L1 of a first sliding rail 21, a second guide post 12 is at a joint 223 of a second sliding rail 22, and an abutting face 321 of the stop 32 abuts against a top of the first guide post 11. In FIG. 17, the first guide post 11 is in a second position L2 of the first sliding rail 21, the second guide post 12 is at an in-position fixed point 22d in the second sliding rail 22, and the stop 32 abuts against a side of the first guide post 11. In some embodiments, when the second guide post 12 is located at the in-position fixed point 22d, the first guide post 11 is in the second position L2. The handle module 100 further includes a slow return element 31 (a torsion spring 31 is exemplified below for illustration, and is assigned the same reference numeral as the slow return element 31) and a stop 32. The stop 32 is pivotably connected to the plate 2. The torsion spring 31 has a retarding force, and the first guide post 11 is pushed toward the second position L2 by means of the stop 32 by using the retarding force.

Referring to FIG. 14 to FIG. 17 together, when the high spring force of the liquid-cooling connector 204 (shown in FIG. 8) and the liquid-cooling adapter 304 ejects the server 200 out of the rack 301, a holding portion 14 of the handle 1 and the server casing 201 are driven to eject out of the rack 301. The first guide post 11 of the handle 1 is snap fitted by using the stop 32 to restrain swinging of the holding portion 14 of the handle 1, so as to reduce an ejecting speed of the holding portion 14 of the handle 1, thereby avoiding a thread to use safety as a result of the holding portion 14 of the handle 1 ejecting out quickly.

Referring to FIG. 14 to FIG. 17 together, in some embodiments, the stop 32 includes an abutting face 321. When the first guide post 11 is in the first position L1, the abutting face 321 is substantially parallel to a major axis 21a of the first sliding rail 21. After the plate 2 is moved in the moving direction W for return, the stop 32 is pushed by the slow return element 31, the abutting face 321 abuts against a tangent position between four quarter points on a top of the first guide post 11 of the sliding column assembly 10, and the first guide post 11 is resisted by the stop 32, so that the first guide post 11 is positioned in the first sliding rail 21 to position the handle 1 after the handle is opened.

In conclusion, according to some embodiments, the sliding column assembly of the handle module is pivotably and slidably disposed in the first sliding rail and the second sliding rail of the plate. During installation of the server in the rack with a long guide stroke, the handle pushes the server in an effort-saving manner, so that the server can be smoothly installed in the rack. Secondly, according to some embodiments, a contact point between the handle and the rack is a pivotable contact point, so as to avoid wear and tear as a result of the handle moving at the point of contact with the rack. A traditional handle is not only rotated at the point at which the handle comes into contact with the rack, but also moved at the contact point on the rack, causing wear and tear between the handle and the rack. Furthermore, according to some embodiments, a slow return element and a stop are added to the handle module. The slow return element and the stop slow down movement of the handle to prevent the handle from ejecting out and hurting a user.

What is claimed is:

1. A handle module for a server, the handle module comprising:
    a handle, comprising a sliding column assembly; and
    a plate, comprising a first sliding rail and a second sliding rail,
    wherein the sliding column assembly is pivotably and slidably disposed in the first sliding rail and the second sliding rail;
    wherein the handle comprises a holding portion and an abutting portion, the sliding column assembly is located between the holding portion and the abutting portion, the second sliding rail comprises a protruding guide section and a sliding section, the protruding guide section is connected to the sliding section, when the sliding column assembly is located at a joint between the protruding guide section and the sliding section, the abutting portion is exposed from the plate, and when the sliding column assembly is pivoted and slid in the sliding section, the abutting portion is substantially maintained at a pivot point;
    wherein an end of the protruding guide section that is opposite to the joint is an inward retraction fixed point, and when the sliding column assembly is located at the inward retraction fixed point, the abutting portion is inward retraction in the plate.

2. The handle module according to claim 1, wherein the sliding column assembly comprises a first guide post and a second guide post, the first guide post is pivotably and slidably disposed in the first sliding rail, the second guide post is pivotably and slidably disposed in the second sliding rail, when the sliding column assembly is pivoted and slid in the sliding section, the plate is moved in a moving direction, the first sliding rail is a substantially linear sliding rail, and a major axis of the linear sliding rail is substantially perpendicular to the moving direction.

3. The handle module according to claim 2, wherein the first guide post is located between the holding portion and the second guide post, and the second guide post is located between the first guide post and the abutting portion.

4. The handle module according to claim 3, wherein the plate has a quadrant angle, the quadrant angle has a quadrant center that is a center of the first sliding rail and a +X direction that is a direction in which the major axis of the first sliding rail extends toward the holding portion, the quadrant angle comprises a second quadrant, and the second sliding rail is substantially located in the second quadrant.

5. The handle module according to claim 2, wherein the second guide post is located between the holding portion and the first guide post, and the second sliding rail is located on one side of the major axis of the first sliding rail.

6. The handle module according to claim 5, wherein the plate has a quadrant angle, the quadrant angle has a quadrant center that is a center of the first sliding rail and a +X direction that is a direction in which the major axis of the first sliding rail extends toward the holding portion, the quadrant angle comprises a third quadrant and a fourth quadrant, and the second sliding rail is located in the third quadrant and the fourth quadrant.

7. The handle module according to claim 2, wherein the first sliding rail is closer to the abutting portion than the second sliding rail.

8. The handle module according to claim 7, wherein the plate has a quadrant angle, the quadrant angle has a quadrant center that is a center of the first sliding rail and a +X direction that is a direction in which the major axis of the first sliding rail extends toward the holding portion, the quadrant angle comprises a first quadrant and a fourth quadrant, and the second sliding rail is located in the first quadrant and the fourth quadrant.

9. The handle module according to claim 8, wherein a distance between the abutting portion and the first sliding rail is greater than 40 mm, when the handle is rotated about the abutting portion, the first guide post of the sliding column assembly is pivoted and slid in the first sliding rail and drives the plate to move along a vertical axis, and the vertical axis is perpendicular to the major axis of the first sliding rail.

10. The handle module according to claim 1, wherein an end of the sliding section that is opposite to the joint is an in-position fixed point, and when the sliding column assembly is pivoted and slid from the joint to the in-position fixed point, the sliding column assembly is pivoted and slid between a first position of the first sliding rail and a second position of the first sliding rail.

11. The handle module according to claim 1, wherein an end of the sliding section that is opposite to the joint is an in-position fixed point, the handle module further comprises a slow return element, two ends of the slow return element are respectively connected to the plate and the handle, the slow return element normally has a retarding force, and the sliding column assembly is pushed toward the in-position fixed point by using the retarding force.

12. The handle module according to claim 11, wherein the handle comprises a positioning portion, the plate comprises a fixing portion, and when the holding portion of the handle is in an open position, the positioning portion is snap fitted to the fixing portion.

13. The handle module according to claim 1, wherein the sliding column assembly comprises a first guide post and a second guide post, the first guide post is pivotably and slidably disposed in the first sliding rail, the second guide post is pivotably and slidably disposed in the second sliding rail, the plate has a moving direction, the first sliding rail is a substantially linear sliding rail, a major axis of the linear sliding rail is substantially perpendicular to the moving direction, an end of the sliding section that is opposite to the joint is an in-position fixed point, the first sliding rail has a first position and a second position, when the second guide post is located at the in-position fixed point, the first guide post is in the second position, the handle module further comprises a slow return element and a stop, the stop is pivotably connected to the plate, the slow return element has a retarding force, and the first guide post is pushed toward the second position by means of the stop by using the retarding force.

14. The handle module according to claim 13, wherein the stop comprises an abutting face, and when the first guide post is in the first position, the abutting face is substantially parallel to the major axis of the first sliding rail.

15. A server, comprising:
a server casing; and
a handle module comprising a handle and a plate, wherein the handle comprises a sliding column assembly, the plate comprises a first sliding rail and a second sliding rail, the sliding column assembly is pivotably and slidably disposed in the first sliding rail and the second sliding rail, and the plate is fixed to the server casing;
wherein the handle comprises a holding portion and an abutting portion, the sliding column assembly is located between the holding portion and the abutting portion, the second sliding rail comprises a protruding guide section and a sliding section, the protruding guide section is connected to the sliding section, when the sliding column assembly is located at a joint between the protruding guide section and the sliding section, the abutting portion is exposed from the plate, and when the sliding column assembly is pivoted and slid in the sliding section, the abutting portion is substantially maintained at a pivot point;
wherein an end of the protruding guide section that is opposite to the joint is an inward retraction fixed point, and when the sliding column assembly is located at the inward retraction fixed point, the abutting portion is inward retraction in the plate.

16. The server according to claim 15, further comprising a server host and a liquid-cooling device, wherein the server host is located in the server casing, and the liquid-cooling device is configured to cool the server host and comprises a liquid-cooling connector located on one side of the server casing.

17. A server system, comprising:
a rack comprising an abutted portion;
a server casing; and
a handle module comprising a handle and a plate,
wherein the handle comprises a sliding column assembly, the plate comprises a first sliding rail and a second sliding rail,
the sliding column assembly is pivotably and slidably disposed in the first sliding rail and the second sliding rail,
the plate is fixed to the server casing, and
when the sliding column assembly is pivoted and slid in a sliding section of the second sliding rail,
an abutting portion of the handle substantially abuts against the abutted portion,
wherein the handle comprises a holding portion and the abutting portion,
the sliding column assembly is located between the holding portion and the abutting portion,
the second sliding rail comprises a protruding guide section and a sliding section,
the protruding guide section is connected to the sliding section,
when the sliding column assembly is located at a joint between the protruding guide section and the sliding section,
the abutting portion is exposed from the plate, and
when the sliding column assembly is pivoted and slid in the sliding section,
the abutting portion is substantially maintained at a pivot point;
wherein an end of the protruding guide section that is opposite to the joint is an inward retraction fixed point, and
when the sliding column assembly is located at the inward retraction fixed point, the abutting portion is inward retraction in the plate.

18. The server system according to claim 17, wherein the rack further comprises a liquid-cooling adapter, the server system further comprises a server host and a liquid-cooling device, the server host is located in the server casing, and the liquid-cooling device is configured to cool the server host and comprises a liquid-cooling connector connected to the liquid-cooling adapter.

* * * * *